United States Patent
Tanaka

(10) Patent No.: US 8,301,033 B2
(45) Date of Patent: Oct. 30, 2012

(54) LD DRIVER WITH AN IMPROVED FALLING EDGE OF DRIVING SIGNAL AND OPTICAL TRANSMITTER PROVIDING THE SAME

(75) Inventor: Keiji Tanaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 469 days.

(21) Appl. No.: 12/752,782

(22) Filed: Apr. 1, 2010

(65) Prior Publication Data

US 2010/0254713 A1 Oct. 7, 2010

(30) Foreign Application Priority Data

Apr. 3, 2009 (JP) .................................. 2009-090999
Oct. 20, 2009 (JP) .................................. 2009-241688

(51) Int. Cl.
*H04B 10/04* (2006.01)
(52) U.S. Cl. ......................... 398/182; 398/188; 398/189
(58) Field of Classification Search ........... 398/182–201
See application file for complete search history.

(56) References Cited

U.S. PATENT DOCUMENTS

| | | | |
|---|---|---|---|
| 4,797,579 A * | 1/1989 | Lewis | 326/27 |
| 5,959,481 A * | 9/1999 | Donnelly et al. | 327/170 |
| 6,285,692 B1 * | 9/2001 | Okayasu | 372/38.02 |
| 6,373,346 B1 | 4/2002 | Kobayashi | |
| 6,618,408 B1 | 9/2003 | Mader et al. | |
| 7,147,387 B2 | 12/2006 | Aronson et al. | |
| 2002/0012145 A1* | 1/2002 | Okayasu et al. | 359/154 |
| 2008/0031379 A1* | 2/2008 | Feldtkeller | 375/295 |
| 2008/0117943 A1* | 5/2008 | Nishiyama | 372/29.02 |

* cited by examiner

*Primary Examiner* — Dzung Tran
(74) *Attorney, Agent, or Firm* — Smith, Gambrell & Russell, LLP

(57) ABSTRACT

An LD driver to generate an asymmetrical driving current with a relatively faster falling edge and an optical transmitter having the LD driver are disclosed. The LD driver includes a primary driver and the sub-driver connected in parallel to the primary driver. The primary driver converts the input signal or the delayed signal delayed from the input signal into the primary current. The sub-driver generates a symmetrical current tracing the input or the delayed signal, and an asymmetrical current formed by the OR operation between the input and delayed signals. The driving current is formed by adding the primary current, the symmetrical current and the asymmetrical current.

15 Claims, 12 Drawing Sheets

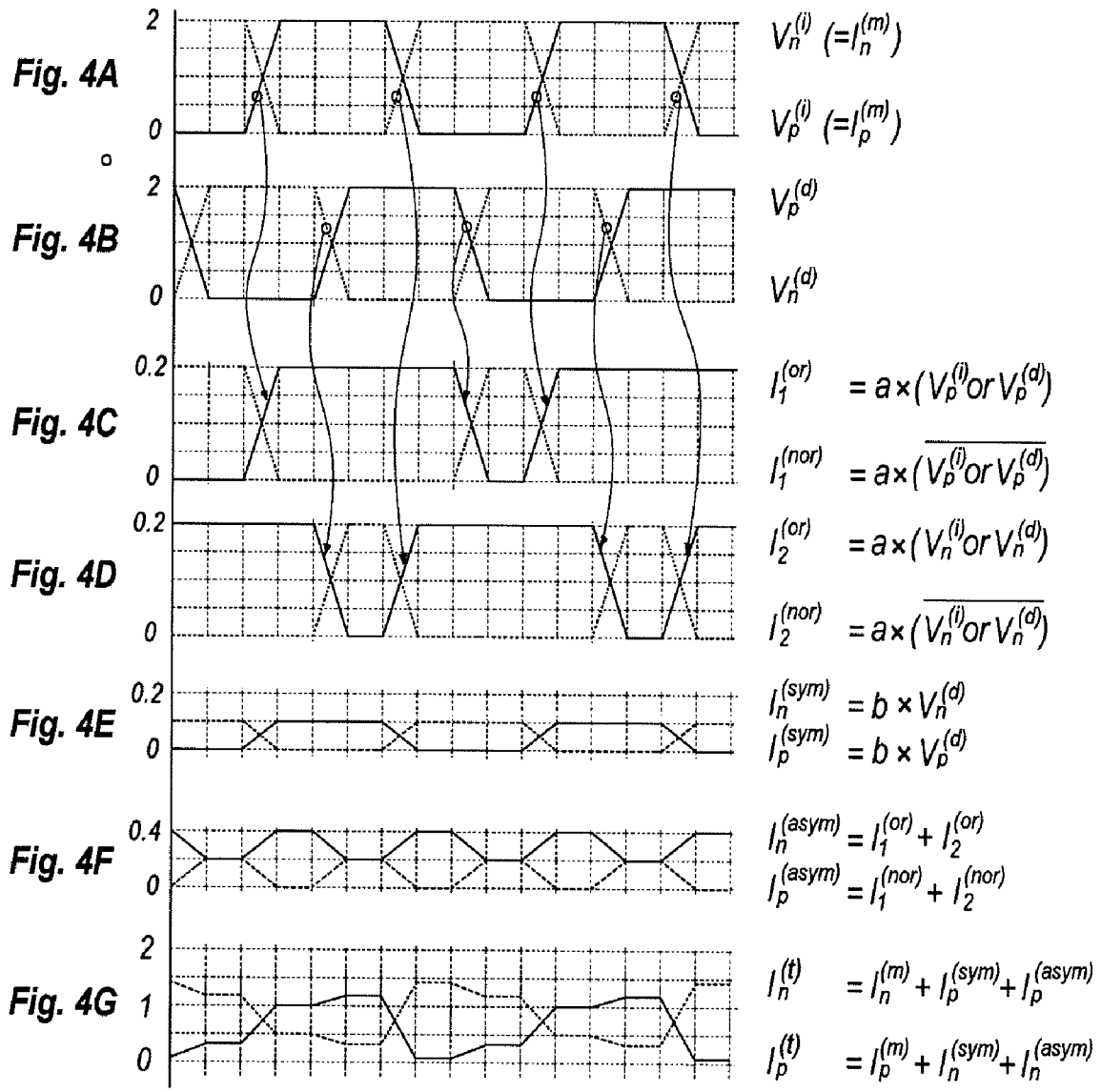

$V_n^{(i)}$
$V_p^{(i)}$ $V_p^{(d)}\ (=I_p^{(m)})$
$V_n^{(d)}\ (=I_n^{(m)})$ $I_1^{(nor)} = a \times (\overline{V_p^{(i)} or V_n^{(d)}})$
$I_1^{(or)} = a \times (V_p^{(i)} or V_n^{(d)})$ $I_2^{(or)} = a \times (V_n^{(i)} or V_p^{(d)})$
$I_2^{(nor)} = a \times (\overline{V_n^{(i)} or V_p^{(d)}})$ $I_p^{(sym)} = b \times V_n^{(i)}$
$I_n^{(sym)} = b \times V_p^{(i)}$ $I_p^{(asym)} = I_1^{(or)} + I_2^{(or)}$
$I_n^{(asym)} = I_1^{(nor)} + I_2^{(nor)}$ $I_n^{(t)} = I_n^{(m)} + I_n^{(sym)} + I_p^{(asym)}$
$I_p^{(t)} = I_p^{(m)} + I_p^{(sym)} + I_n^{(asym)}$

LD DRIVER WITH AN IMPROVED FALLING EDGE OF DRIVING SIGNAL AND OPTICAL TRANSMITTER PROVIDING THE SAME

BACKGROUND OF THE INVENTION

1. The present invention relates to a laser diode driver (hereafter denoted as LD driver) and an optical transmitter providing the LD driver.

2. Related Prior Art

One type of techniques to driver the LD has been well known as the shunt driver, in which an active device such as a transistor is connected in parallel to the LD. A U.S. Pat. No. 6,618,408, has disclosed such an LD driver where the LD is modulated by driving an FET connected in parallel to the LD. Because the active device such as an FET has a substantial gain, the signal to modulate the active device may be reduced in the shunt drive configuration, which may consequently reduce the power consumption.

It has been also known in the field that the shunt drive configuration degrade the optical waveform output from the LD compared to a case where the LD is driven by other configuration such as a series driver. Another U.S. Pat. No. 6,373,346, has disclosed a technique to improve the output waveform of the LD by a driver able to pre-emphasize or de-emphasize the driving signal, in which the driver generates a positive or negative peaking signal from the input signal and superposes this peaking signal on the input signal. The optical waveform output from the LD may be adjusted by using the pre-emphasized or de-emphasized modulation signal even when the LD is shunt-driven.

$I_n$ another aspect, the optical waveform output from the LD intrinsically shows a faster leading edge and a relatively slower falling edge due to the carrier relaxation mechanism within the active region of the LD. $I_n$ another words, the optical output of the LD shows an inductive leading edge and a capacitive falling edge. Because the pre-emphasizing or de-emphasizing of the driving signal only provides a driving signal with a leading edge symmetrical to a falling edge, the asymmetry of the optical waveform of the LD may not be compensated. Still another United States Patent, U.S. Pat. No. 7,147,387, has disclosed an LD driver that enables to generate a driving signal with an asymmetrical leading and falling edges. The technique disclosed therein; (1) makes two intermediate signals, one of which is a difference between an input signal and another signal delayed by the input signal, another one is an exclusive-OR of the two signals mentioned above; and (2) combines thus formed two signals with a preset ratio.

SUMMARY OF THE INVENTION

One aspect of the present invention relates to an LD driver that generates a driving current for an LD. The driving current has a falling edge faster than a leading edge thereof. The LD driver comprises a delay unit, a primary driver and a sub-driver. The delay unit delays an input signal by a variable period and outputs a delayed signal. The primary driver converts one of the input signal and the delayed signal to a primary current by a first conversion ratio. The sub-driver that is connected in parallel to the primary driver includes a symmetrical driver and an asymmetrical driver. The symmetrical driver converts one of the input signal and the delayed signal into a symmetrical current by a second conversion ratio. The asymmetrical driver includes two arithmetic units each carrying out the OR operation between the input signal and the delayed signal, and converts a result of this OR operation into an asymmetrical current with a third conversion ratio. The LD driver of the present invention generates the driving current by adding the primary current, the symmetrical current and the asymmetrical current.

The input signal, the delayed signal, the primary current, the symmetrical current and the asymmetrical current may have the differential mode with a negative phase signal and a positive phase signal. The driving current adds the primary current with the positive phase with the symmetrical and asymmetrical currents with the negative phase. One of the arithmetic unit may carry out the OR operation between the input and delayed signals each having the positive phase, while the other of the arithmetic unit may carry out the OR operation between the input and delayed signals with the negative phase; or one of the arithmetic unit carries out the OR operation between the input and delayed signals each having an opposite phase, while the other of the arithmetic unit may also carry out the OR operation between the input and delayed signals each having the opposite phase but different from those for the former arithmetic unit.

Another aspect of the present invention relates to an optical transmitter that includes a transmitter optical subassembly (hereafter denoted as TOSA) and an LD driver. The TOSA has a configuration called as the shunt driving that includes an LD and a transistor connected in parallel to each other. The transistor may shut the current provided to the LD by being modulated by the driving signal. The LD driver includes a primary driver and a sub-driver connected in parallel to the primary driver. The primary driver converts the input signal or the delayed signal delayed by a variable period to the input signal into a primary current by a first conversion ratio. The sub-driver includes a symmetrical driver and an asymmetrical driver. The symmetrical driver concerts the other of the input and delayed signals into a symmetrical current by a second conversion ratio. The asymmetrical driver includes two arithmetic unit each carrying out the OR operation of the input and delayed signals, and converts results of the OR operation into an asymmetrical current by a third conversion ratio. The LD driver adds the primary current, the symmetrical current, and the asymmetrical current to generate the driving current.

BRIEF DESCRIPTION OF DRAWINGS

FIGS. 4A to 4G show time charts of respective units in the LD driver 3;

DETAILED DESCRIPTION OF DRAWINGS

Figure 1:
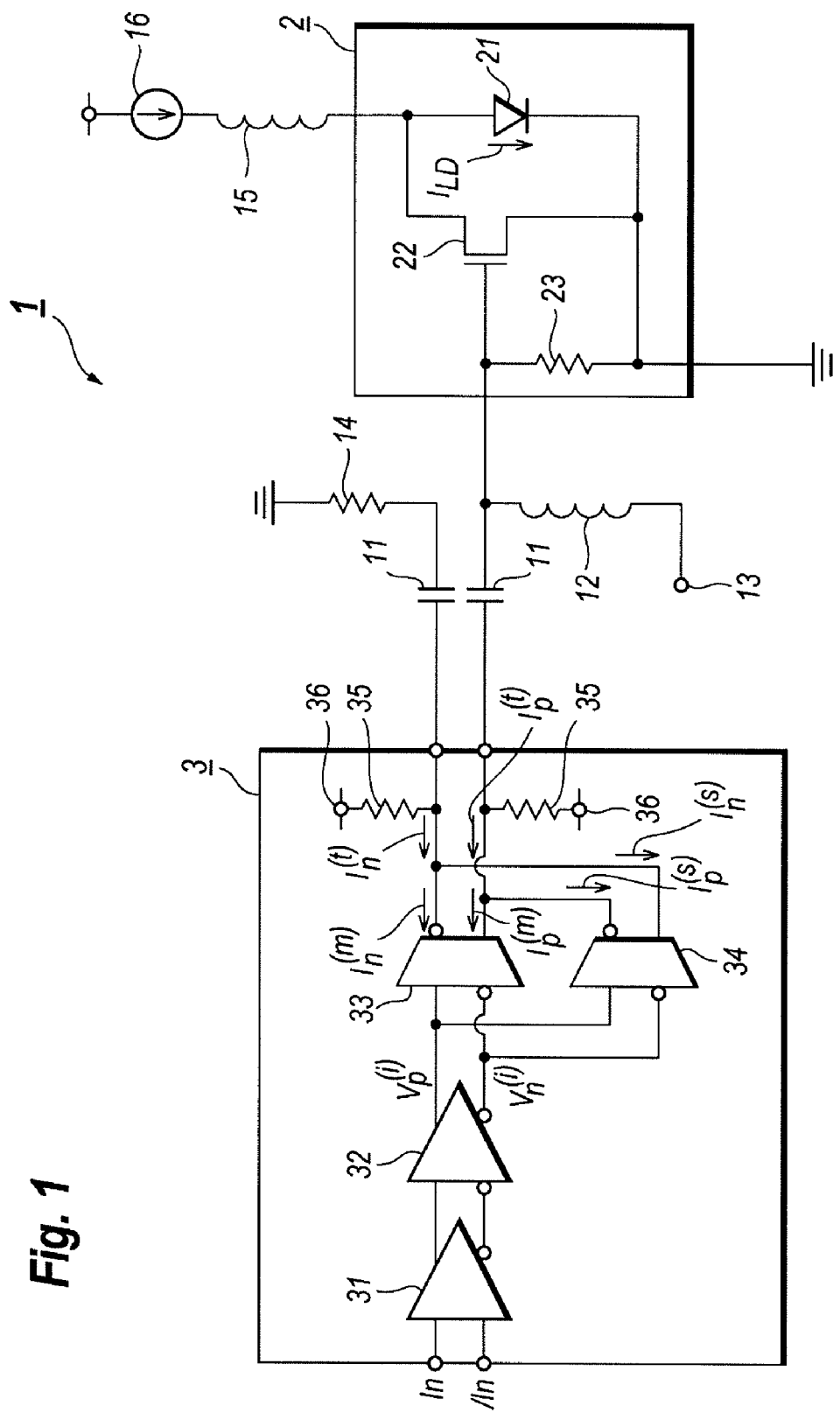
FIG. 1 is a circuit diagram of an optical transmitter according to an embodiment of the present invention.

Next, preferred embodiments of the present invention will be described as referring to accompanying drawings. In the drawings, the same numerals or the symbols will refer to the same elements without overlapping explanations.

(First Embodiment)

FIG. 1 is a circuit diagram of an optical transmitter 1 according to an embodiment of the present invention. The optical transmitter 1 shown in FIG. 1 comprises a transmitter subassembly (hereafter denoted as TOSA) 2, an LD driver 3, and a bias current source 16. The LD driver 3 couples with the TOSA 2 in the AC mode through the coupling capacitors 11, specifically, one of the outputs of the LD driver is brought to the input of the TOSA through the capacitor 11, where the input of the TOSA 2 is biased through an inductor 12, while, the other output of the LD driver 3 is terminated through the coupling capacitor 11 and a resistor 14. The TOSA 2 is biased by the current source 16 through an inductor 15.

Figure 2:
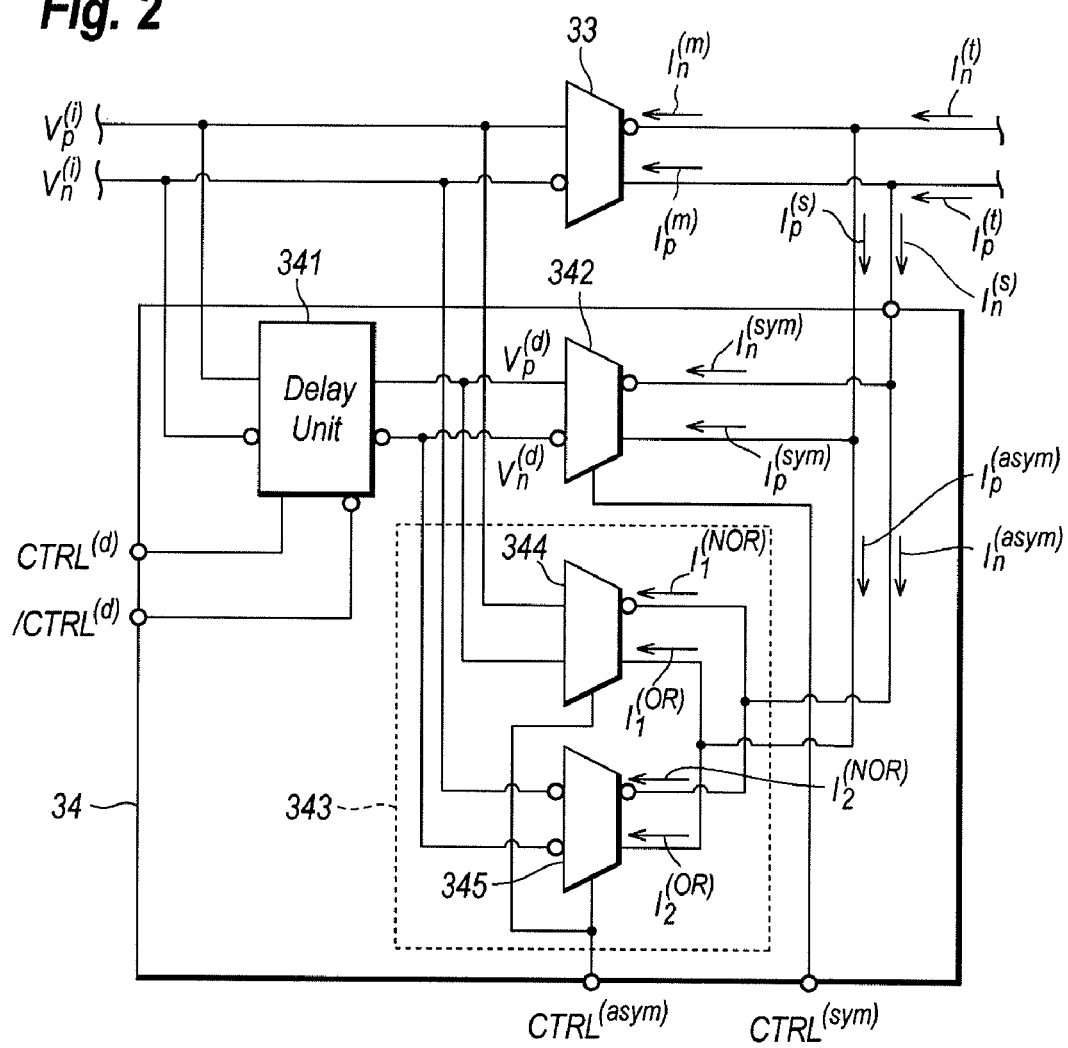
FIG. 2 shows details of the optical transmitter shown in FIG. 1.

The TOSA 2 includes a laser diode (LD) 21, a field effect transistor (hereafter denoted as FET) 22, and a terminator 23. The LD 21 and the FET 22 are connected in parallel with respect to the bias current source 16; specifically, the anode of the LD 21 and the drain of the FET 22 are commonly coupled with the current source through the inductor 15, while, the cathode of the LD 21 and the source of the FET 22 are grounded. Thus, the arrangement of the TOSA 2 shown in FIG. 2 is, what is called, a type of the shunt driver for the LD 21 with the single phase driving. The inductor 15 may isolate the bias source 16 from the driving signal proved to the FET 22. The inductor 15 may be implemented within the TOSA 2. Although the embodiment shown in FIG. 1 provides the inductor 15, an active element such as a transistor, may be replaced to the inductor 15. The terminator 23, which terminates the input of the TOSA 2 to the ground, is coupled with the gate of the FET 22; accordingly, the gate of the FET 22 is biased by the external bias source 13 through the inductor 12.

The LD driver 3 includes a plurality of buffer drivers, 31 and 32, a primary driver 33, and a sub-driver 34. Two outputs of the primary driver 33 are each pulled up to the power supply 36 through a resistor 35 to bias the outputs of the primary driver 33. Two resistors each shows a function of the back terminator for the transmission lines between the LD driver 3 and the TOSA 2, which restricts the reflection of a signal reflected by the TOSA 2 and heading the LD driver 3. Three drivers, 31 to 33, are connected in series, while, the sub-driver 34 is connected in parallel with respect to the primary driver 33, and the outputs of the primary driver 33 and those of the sub-driver 34 are commonly coupled with the outputs of the LD driver 3. Thus, the outputs of the sub-drivers 34 are also pulled up to the power supply 36. As already described, the outputs of the LD driver 3 are grounded through the coupling capacitor 11 and the termination resistor 14 or the terminator 34 in the TOSA 2.

The first buffer driver 31, whose inputs are coupled with the input terminals of the LD driver 3, amplifies signals, $I_n$ and $/I_n$, differential to each other which are supplied to the input terminals of the LD driver 3. The second buffer driver 32 placed in the downstream of the first buffer driver 31 drives the main driver 33 and the sub-driver by the output signals thereof, $V_p^{(i)}$ and $V_n^{(i)}$; hence, the second buffer driver 32 is preferable to have low output impedance. The primary driver 33 outputs differential driving currents, $I_p^{(m)}$ and $I_n^{(m)}$, that are converted from the signals, $V_p^{(i)}$ and $V_n^{(i)}$; while, the sub-driver 34 outputs other driving currents, $I_p^{(s)}$ and $I_n^{(s)}$, which also reflect the signals, $V_p^{(i)}$ and $V_n^{(i)}$. Accordingly, the LD driver 3 outputs the currents, $I_p^{(t)}$ and $I_n^{(t)}$, that is, the sum of the main currents, $I_p^{(m)}$ and $I_n^{(m)}$, and the sub currents, $I_p^{(s)}$ and $I_n^{(s)}$.

FIG. 2 shows the sub-driver 34 shown in FIG. 1 in detail. The sub-driver 34 includes a delay unit 341, a symmetrical driver 342, and an asymmetrical driver 343. Furthermore, the asymmetrical driver 343 includes two arithmetic units, 344 and 345. The sub-driver 343 receives the differential signal, $V_p^{(i)}$ and $V_n^{(i)}$, from the second buffer driver 32. The delay unit 341 delays the input differential signals, $V_p^{(i)}$ and $V_n^{(i)}$, by a time τ and generates delayed signals, $V_p^{(d)}$ and $V_n^{(d)}$, which also have the differential configuration. The delay unit 341 may adjust the delay time τ by the control signal, $CTRL^{(d)}$ and $/CTRL^{(d)}$, provided to the control terminal of the sub-driver 34. In the arrangement shown in FIG. 2, the control signal $CTRL^{(d)}$ and $/CTRL^{(d)}$ also has the differential configuration.

Figure 3A:
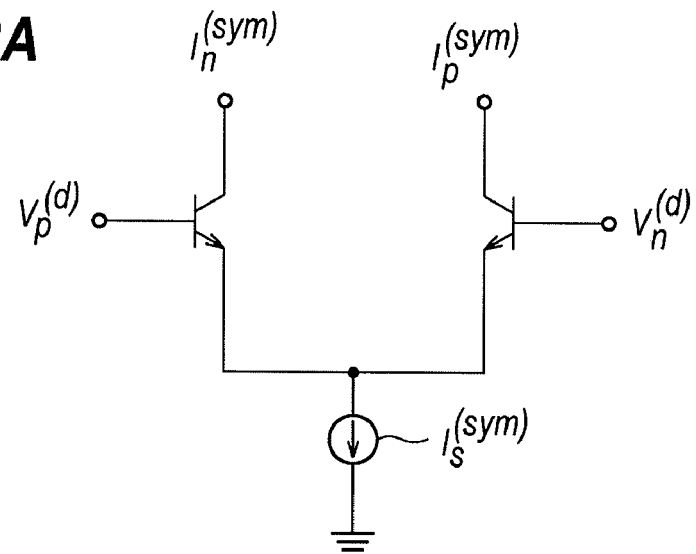
FIG. 3A illustrates a typical circuit diagram applicable to the symmetrical driver.

The symmetrical driver 342 converts the delayed signal, $V_p^{(d)}$ and $V_n^{(d)}$ into the symmetrical currents, $I_p^{(sym)}$ and $I_n^{(sym)}$, which also has the differential configuration. FIG. 3A illustrates a typical circuit diagram applicable to the symmetrical driver 342, which is an ordinary differential circuit. The current source $I_s^{(sym)}$ of the differential circuit may be adjustable by an external signal $CTRL^{(sym)}$, namely, the conversion ratio from the voltage to the current of the symmetrical driver 342 is varied by the signal $CTRL^{(sym)}$, and this current is directly reflected in the output current, $I_p^{(sym)}$ and $I_n^{(sym)}$, of the symmetrical driver 242.

The first arithmetic unit 344 in the asymmetrical driver 343 operates a function of the logical OR of the input signal $V_p^{(i)}$ and its delayed signal $V_p^{(d)}$ and generates the currents, $I_1^{(NOR)}$ and $I_1^{(OR)}$; while, the other arithmetic unit 345 operates the logical OR of the input signal $V_n^{(i)}$ and its delayed signal $V_n^{(d)}$ and generates the currents, $I_2^{(OR)}$ and $I_2^{(NOR)}$. Among four output currents, two currents, $I_1^{(NOR)}$ and $I_2^{(NOR)}$ are summed to form a composite asymmetrical current $I_n^{(asym)}$, while, other two currents, $I_1^{(OR)}$ and $I_2^{(OR)}$, are also summed to form another composite asymmetrical current $I_p^{(asym)}$.

Figure 3B:
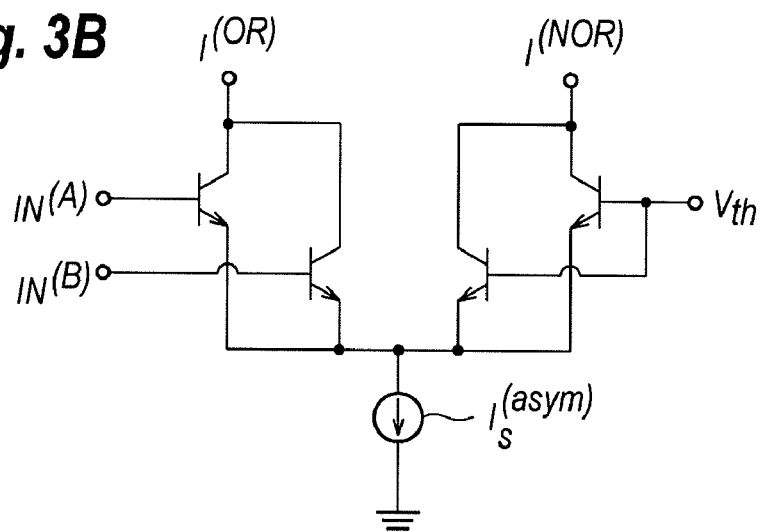
FIG. 3B illustrates a typical arrangement of the arithmetic unit shown in FIG. 2.

The arithmetic units, 344 and 345, may be comprised of, for instance, a type of the differential circuit shown in FIG. 3B. Referring to FIG. 3B, when at least one of the inputs, A and B, in a voltage level thereof exceeds the reference $V_{th}$, the circuit may flow the source current $I_s^{(asym)}$ in the output terminal OR as the current $I^{(OR)}$; while, both inputs, A and B, are less than the reference $V_{th}$, the circuit may flow the source current $I_s^{(asym)}$ in the output terminal NOR as the current $I^{(asym)}$. The reference $V_{th}$ is the threshold for the logical decision of the arithmetic unit. In the present embodiment, the source current $I_s^{(asym)}$ may be adjustable, as shown in FIG. 2, by an external signal, $CTLR^{(asym)}$, where the conversion ratio from the voltage to the current may be determined.

The current $I_p^{(asym)}$ output from the asymmetrical driver 343 is combined with the current $I_p^{(sym)}$ output from the symmetrical driver 342 to generate the current $I_p^{(s)}$, which is output from the sub-driver 34. While, the current $I_n^{(asym)}$ output from the asymmetrical driver 343 is combined with the current $I_n^{(sym)}$ output from the symmetrical driver 342 to generate the current $I_n^{(s)}$ which is output from the sub-driver 34.

Moreover, the output currents $I_n^{(s)}$ provided from the sub-driver 34 are combined with the currents $I_p^{(m)}$ provided from the primary driver 33 to generate the summed current $I_p^{(t)}$; while, the other output current $I_p^{(s)}$ of the sub-driver 34 is combined with the other current $I_n^{(m)}$ of the primary driver 33 to generate the other summed current $I_n^{(t)}$. Finally, the former summed current $I_p^{(t)}$ is supplied to the termination resistor 23 through the coupling capacitor 11 of the TOSA 2; while, the other summed current $I_n^{(t)}$ is provided to the other termination resistor 14.

Next, an operation of the optical transmitter 1 will be described as referring to FIG. 4, which show time charts of respective signals. The horizontal axis shows a time in an arbitrary scale; while, the vertical axis corresponds to the voltage or the current also in an arbitrary unit. The description presented below assumes that (1) the optical transmitter 1 receives the input signal $V_p^{(i)}$ and $V_n^{(i)}$ as shown in FIG. 4A; (2) the delay unit 341 delays this input signals, $V_p^{(i)}$ and $V_n^{(i)}$, by two periods ($\tau=2$); (3) the primary driver 33, the symmetrical driver 342 and the asymmetrical driver 343 show no delay between the input and the output thereof, then the rising edge and the falling edge of the output signal therefrom fully follows those of the input signal therein.

Under the conditions above, the output, $V_p^{(d)}$ and $V_n^{(d)}$, of the delay unit 341 delays the input signals, $V_p^{(i)}$ and $V_n$, by two periods as shown in FIG. 4B. The first asymmetrical unit 344 performs the logical NOR of the two signals, $V_p^{(i)}$ and $V_p^{(d)}$, which is shown in FIG. 4C and corresponds to the output current $I_1^{(NOR)}$. The falling edge of $I_1^{(NOR)}$ is determined by the rising edge of $V_p^{(i)}$ and the rising edge of $I_1^{(NOR)}$ is determined by the falling edge of $V_n^{(d)}$. While, the other asymmetrical unit 345 carries out the logical NOR of other two signals, $V_n$ and $V_n^{(d)}$, and generates the output current $I_2^{(NOR)}$ shown in FIG. 4D. That is, the rising edge of $I_2^{(NOR)}$ is determined by the falling edge of $V_n^{(d)}$ and the falling edge of $I_2^{(NOR)}$ is determined by the rising edge of $V_n^{(i)}$. Here, the conversion ratio from the voltage, $V_p$ or $V_n$, to the current $I_1$ or $I_2$ is determined by a coefficient a controlled by the $CTRL^{(asym)}$.

The symmetric driver 342 generates the currents, $I_p^{(sym)}$ and $I_n^{(sym)}$, based on the outputs, $V_p^{(d)}$ and $V_n^{(d)}$, of the delay unit 341, but the magnitude thereof may be varied by the symmetrical current source $I_s^{(sym)}$, which is denoted by a coefficient a in FIG. 4E, and the phase of the outputs are inverted as shown in FIG. 4E; that is, the output currents, $I_p^{(sym)}$ and $I_n^{(sym)}$, of the symmetrical unit 342 inversely trace the outputs, $V_p^{(d)}$ and $V_n^{(d)}$, of the delay unit 341 with the magnitude thereof being adjusted. Note that the vertical scale of FIG. 4E is ⅓ compared to FIG. 4B.

FIG. 4F merges the outputs of two arithmetic units, 343 and 344. That is, FIG. 4F corresponds to the sum of the solid lines each shown in FIGS. 4C and 4D, which is the output $I_n^{(asym)}$ of the asymmetrical unit 343. Finally, FIG. 4G merges the currents, $I_n^{(asym)}$, $I_n^{(sym)}$ and $I_p^{(m)}$, which generates the summed current $I_p^{(t)}$, where the current $I_p^{(m)}$ of the primary driver 33 fully traces the input signal $V_p^{(i)}$ shown in FIG. 4A. As shown in FIG. 4G, the output current $I_p^{(t)}$ shows an asymmetrical behavior of a faster falling time and a relatively slower rising time, and this output current $I_p^{(t)}$ may be substantially reflected in the optical output of the LD 21; specifically, the output current $I_p^{(t)}$ flows in the load resistor comprised of a parallel connection of the resistor 35 for the back termination and the termination resistor 23 in the TOSA 2, which generates a voltage signal provided to the gate of the FET 22 to turn on and off the FET 22, thus the current provided from the current source 16 may be shunted to the LD 21 or the FET 22. The current shunted to the LD 21 becomes in phase to the output current $I_p^{(t)}$ shown in FIG. 4G. Therefore, the optical output from the LD 21 may show a faster falling time and a compensated rising time.

Further referring to FIG. 4, a broken line of FIG. 4C shows a behavior of the current $I_1^{(OR)}$ output from the first arithmetic unit 354, which corresponds to the logical OR of two signals, $V_p^{(i)}$ and $V_p^{(d)}$; while, the broken line of FIG. 4D corresponds to the current $I_2^{(OR)}$ output from the second arithmetic unit 355, which corresponds to the logical OR of two signals, $V_n^{(i)}$ and $V_n^{(d)}$. Further, the broken line in FIG. 4E corresponds to the current output $I_n^{(sym)}$ from the symmetrical driver 342, whose magnitude is also adjusted by the coefficient a. These three currents, $I_1^{(OR)}$, $I_2^{(OR)}$, and $I_n^{(sym)}$ have the phase opposite to respective paired currents, $I_1^{(NOR)}$, $I_2^{(NOR)}$ and $I_p^{(sym)}$. I, FIG. 4F, the current $I_n^{(asym)}$ is shown as a broken line, whose phase is also opposite to the paired current $I_p^{(asym)}$ but the magnitude thereof shows a particular behavior. That is, the current $I_n^{(asym)}$ is a sum of two currents, $I_1^{(OR)}$ in FIGS. 4C and $I_2^{(OR)}$ in FIG. 4D, but never falls to zero referring to the broken line in FIG. 4C and that in FIG. 4D; when one of the currents, $I_1^{(OR)}$ or $I_2^{(OR)}$, falls to zero, the other of the currents is kept in high level. Accordingly, the current $I_n^{(asym)}$ never falls to zero, as shown in the broken line in FIG. 4F. The broken line in FIG. 4G shows a behavior of the output current $I_n^{(t)}$ of the LD driver 3, which also has a phase opposite to the aforementioned current $I_p^{(t)}$; that is, the output currents, $I_p^{(t)}$ and $I_n^{(t)}$, of the LD driver 3 according to the present embodiment become a differential signal.

(Second Embodiment)

Figure 5:
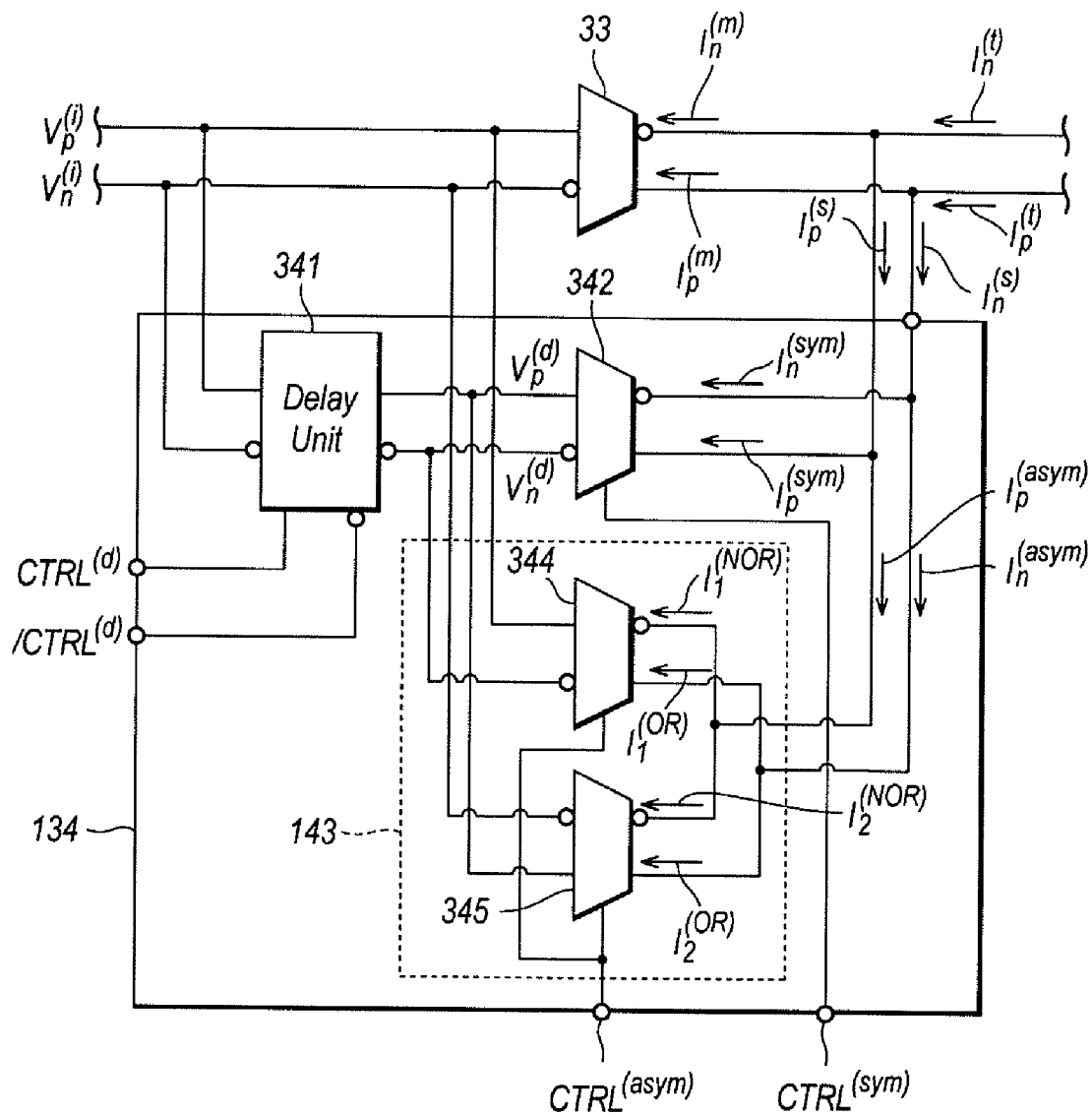
FIG. 5 shows another arrangement of the sub-driver according to the second embodiment of the present invention.
Figure 6:
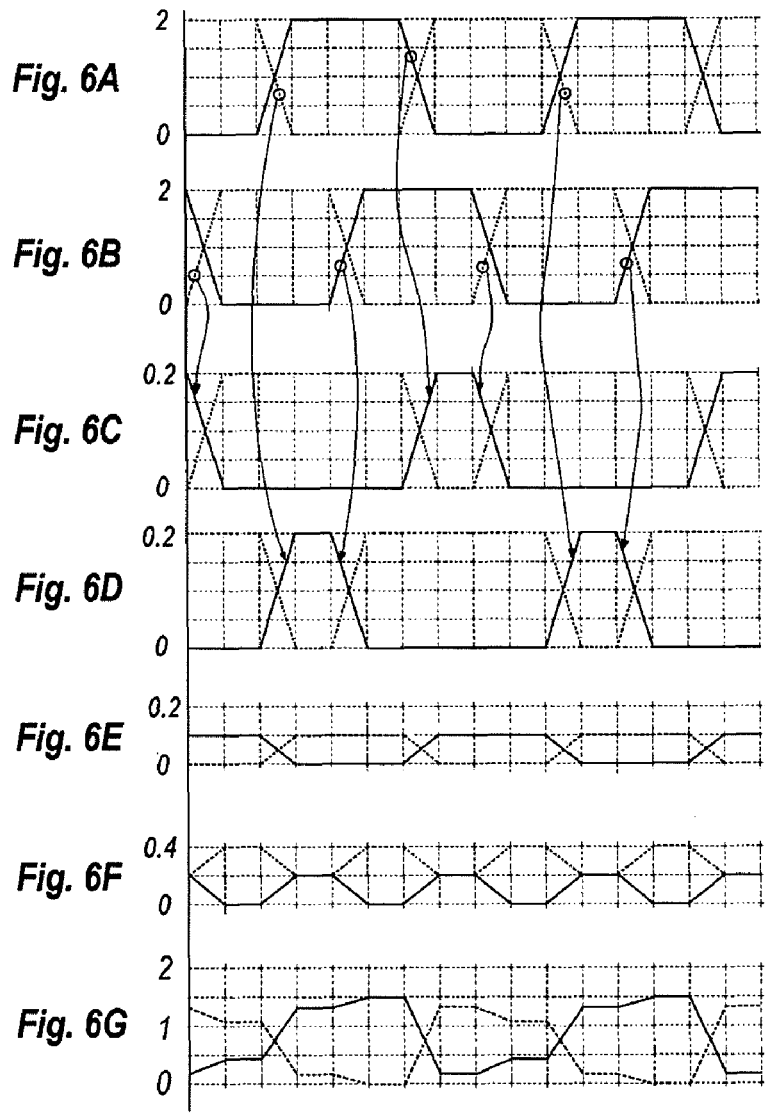
FIGS. 6A to 6G illustrate time charts of respective units in the LD driver of the second embodiment.

The sub-driver 34 is not restricted in the arrangement thereof shown in FIG. 2. One of alternates of the sub-driver 34 is shown in FIG. 5 in detail. The first arithmetic unit 344 in FIG. 5 receives the one of input signals $V_p^{(i)}$ with the positive phase but receives the other of delayed signals $V_n^{(d)}$ with the negative phase, which is one difference from the aforementioned arrangement shown in FIG. 2, and carries out the OR and NOR operations of these two signals to output the currents, $I_1^{(OR)}$ and $I_1^{(NOR)}$. While, the second arithmetic unit 345 receives the other input signal $V_n^{(i)}$ with the negative phase but receives the other delayed signals $V_p^{(d)}$ with the positive phase, which is the second difference from the aforementioned arrangement. The second arithmetic unit 345 also carries out the OR and NOR operations to output two currents, $I_2^{(OR)}$ and $I_2^{(NOR)}$. Two currents, $I_1^{(NOR)}$ and $I_2^{(NOR)}$ are summed to form one asymmetrical current $I_p^{(asym)}$, while, the other two currents, $I_1^{(OR)}$ and $I_2^{(OR)}$, are also summed to form the other asymmetrical current $I_n^{(asym)}$ with the negative phase. These two currents, $I_p^{(asym)}$ and $I_n^{(asym)}$, are output from the asymmetrical driver 143 with a new arrangement.

The asymmetrical outputs, $I_p^{(asym)}$ and $I_n^{(asym)}$, are summed to the output currents, $I_p^{(sym)}$ and $I_n^{(sym)}$, coming from the symmetrical driver 342 to generate the currents, $I_p^{(s)}$ and $I_n^{(s)}$, of the sub-driver 134. The other arrangements shown in FIG. 5 except for the arrangement of the sub-driver 143 are same with those of the aforementioned arrangement of the LD driver 3.

Time charts concerning to the arrangement of the modified sub-driver 134 will be described as referring to FIGS. 6A to 6G. Similar to the time charts in FIGS. 4A to 4G, vertical axes denote the voltage or the current in an arbitrary unit, while, the horizontal axis corresponds to the time also in an arbitrary unit. The same conditions are assumed, that is, the delay unit 341 delays the input signal thereof by two intervals, and all units of the primary driver 33, the symmetrical and asymmetrical drivers, 342 to 345, show the rising and falling times far smaller than those of the original input signals, $V_p^{(i)}$ and $V_n^{(i)}$; that is, the rising and falling characteristics of the input signals are almost fully reflected in the output signals, $V_p^{(t)}$ and $V_n^{(t)}$, and others.

FIGS. 6A and 6B show the time charts of the input signals, $V_p^{(i)}$ and $V_n^{(i)}$, and those of the delayed signals, $V_p^{(d)}$ and $V_n^{(d)}$, which are the same with those shown in FIGS. 4A and 4B. FIG. 6C shows the output of the first arithmetic unit 344, which carries out the logical operation of $V_p^{(i)}$ OR $V_n^{(d)}$. Note that, comparing the first embodiment shown in FIG. 2, the first arithmetic unit 344 performs the operation of $V_p^{(i)}$ OR $V_n^{(d)}$, not $V_p^{(d)}$. The output of the first arithmetic unit 344 has the configuration of the differential mode for $I_1^{(OR)}$ and $I_1^{(NOR)}$. FIG. 6D shows the output of the second arithmetic unit 345, which carries out the logical operation of $V_n^{(i)}$ OR $V_p^{(d)}$, not $V_n^{(d)}$. Thus, the embodiment shown in FIG. 5 changes the outputs of the delay unit 341. FIG. 6E is the current outputs, $I_p^{(sym)}$ and $I_n^{(sym)}$, of the symmetrical driver 342; while, FIG. 6F is the sum of two outputs each coming from the arithmetic units, 344 and 345, which corresponds to the outputs, $I_p^{(asym)}$ and $I_n^{(asym)}$, of the asymmetrical driver 143. Parameters a and b correspond to the conversion ratio from voltage to current in respective drivers, 342, 344 and 345, which are determined by the control signals $CTRL^{(sym)}$ and $CTR^{(asym)}$. Finally, FIG. 6G shows the total currents, $I_p^{(t)}$ and $I_n^{(t)}$, output from the LD driver shown in FIG. 5, which are the sum of the outputs, $I_p^{(m)}$ and $I_n^{(m)}$, of the primary driver 33 and the outputs, $I_p^{(s)} = I_p^{(sym)} + I_p^{(asym)}$ and $I_n^{(s)} = I_n^{(sym)} + I_n^{(asym)}$, of the sub-driver 134. As shown in FIG. 6G, the output currents $I_p^{(t)}$ shows a slower rising time and a relatively faster falling time. The faster falling time may promptly cut the emission of the LD 21 off, and the slower rising time may effectively compensate the overshooting and undershooting of the emission at the turning on of the LD 21.

(Third Embodiment)

Figure 7:
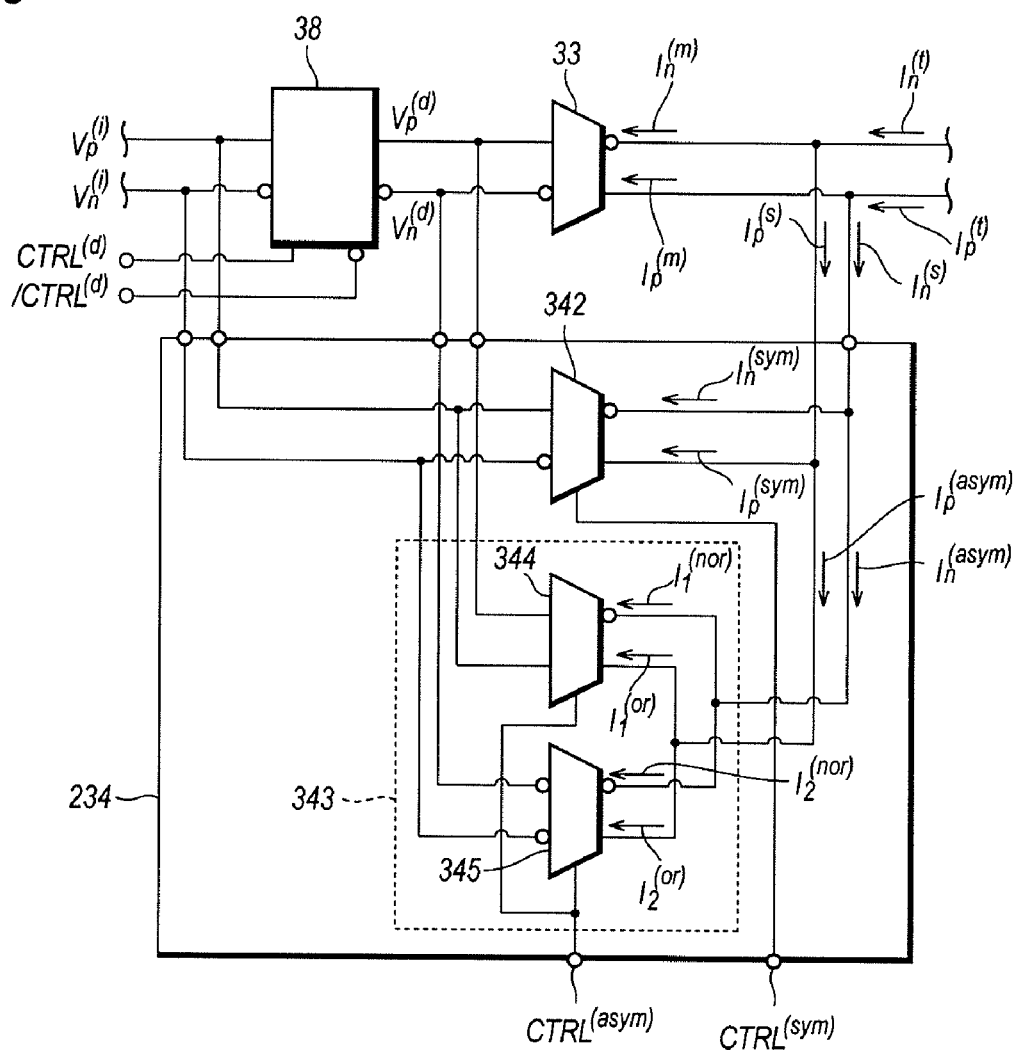
FIG. 7 shows still another arrangement of the sub-driver according to the third embodiment of the present invention.

FIG. 7 illustrates a circuit diagram of a primary portion of the LD driver including a third embodiment of the sub-driver 234. The LD driver shown in FIG. 7 provides the delay unit 38 outside of the sub-driver 234. The delay unit 38 is disposed between the second buffer driver 23 and the primary driver 33, and delays the differential signal, $V_p^{(i)}$ and $V_n^{(i)}$, output from the second buffer driver 32 by a time τ to generate the delayed signal, $V_p^{(d)}$ and $V_n^{(d)}$. The primary driver 33 receives thus delayed signal, $V_p^{(d)}$ and $V_n^{(d)}$, but the sub-driver 234 receives the output, $V_p^{(i)}$ and $V_n^{(i)}$, same as those of aforementioned embodiments. The primary driver 33 converts the delayed signal, $V_p^{(d)}$ and $V_n^{(d)}$, into the primary driving current, $I_p^{(m)}$ and $I_n^{(m)}$; while, the sub-driver 234 converts the input signal, $V_p^{(i)}$ and $V_n^{(i)}$, into the sub-current, $I_p^{(s)}$ and $I_n^{(s)}$. These currents, $I_p^{(m)}$ and $I_n^{(m)}$, and $I_p^{(s)}$ and $I_n^{(s)}$, also have the differential mode.

Referring to FIG. 7, the input signal, $V_p^{(i)}$ and $V_n^{(i)}$, is provided to the symmetrical driver 342 and the asymmetrical driver 343; while the delayed signal, $V_p^{(d)}$ and $V_n^{(d)}$, is provided only to the asymmetrical driver 343. The symmetrical driver 342 converts the input signal, $V_p^{(i)}$ and $V_n^{(i)}$, to the symmetrical currents, $I_p^{(sym)}$ and $I_n^{(sym)}$ with a conversion ratio determined by the signal $CTRL^{(sym)}$. The asymmetrical driver 343 also includes the first and second arithmetic units, 344 and 345, which may operate the OR/NOR function. That is, the first arithmetic unit 344 performs the OR/NOR operation between $V_p^{(d)}$ and $V_p^{(i)}$, and outputs the currents, $I_1^{(m)}$ and $I_1^{(NOR)}$, which is the same as the first arithmetic unit 34 shown in FIG. 4. While, the second arithmetic unit 345 carries out the OR/NOR operation between $V_n^{(d)}$ and $V_n^{(i)}$, and generates the currents, $I_2^{(OR)}$ and $I_2^{(NOR)}$, which is also same as that of the first embodiment. The conversion ratio of the currents, $I_1^{(OR)}$, $I_1^{(NOR)}$, $I_2^{(OR)}$ and $I_2^{(NOR)}$, are determined by the control signal, $CTRL^{(asym)}$ shown in FIG. 3. Two currents, $I_1^{(OR)}$ and $I_2^{(OR)}$, are summed to the asymmetrical current $I_p^{(asym)}$ with the positive phase, and other two currents, $I_1^{(NOR)}$ and $I_2^{(NOR)}$, are also summed to the other asymmetrical current $I_n^{(asym)}$ with the negative phase. These asymmetrical currents, $I_p^{(asym)}$ and $I_n^{(asym)}$, are summed with the symmetrical currents, $I_p^{(sym)}$ and $I_n^{(sym)}$, with a condition where the phases of the currents are maintained, that is, the asymmetrical current with the positive phase $I_p^{(asym)}$ is summed with the symmetrical current $I_p^{(sym)}$ with the positive phase to generate the output current with the positive phase $I_p^{(s)}$, while, the asymmetrical current with the negative phase $I_n^{(asym)}$ is summed with the symmetrical current with the negative phase $I_n^{(sym)}$ to output the current with the negative phase $I_n^{(s)}$.

The sub currents, $I_p^{(s)}$ and $I_n^{(s)}$, output from the sub-driver 234 are summed with the primary current, $I_p^{(m)}$ and $I_n^{(m)}$, with the in-phase mode to generate the total driving currents, $I_p^{(t)}$ and $I_n^{(t)}$. The former total current $I_p^{(t)}$ is provided to the TOSA 2 through the coupling capacitor 11, while, the latter total current $I_n^{(t)}$ are provided to the termination resistor 14 through the capacitor 11. The delay unit 38 in the present embodiment may adjust the delay time depending on the control signals, $CTRL^{(d)}$ and $/CTRL^{(d)}$, externally provided thereto with the differential mode.

Figure 8:
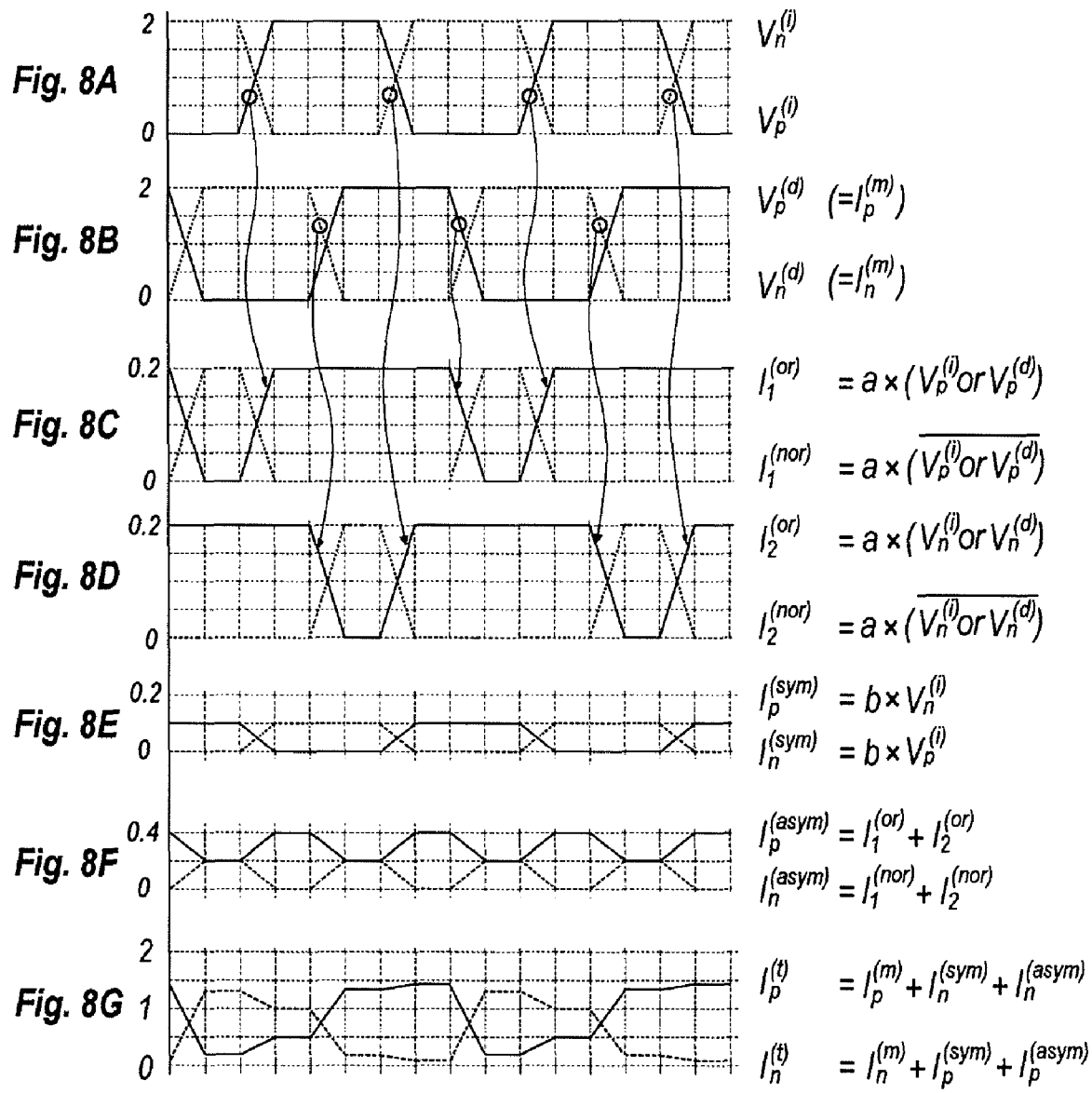
FIGS. 8A to 8G illustrate time charts of respective units in the LD driver of the third embodiment.

FIGS. 8A to 8G each shows a time chart of respective elements of the LD driver shown in FIG. 7. These time charts also have the arbitrary unit in respective vertical axes, while, the horizontal axis corresponds to time. FIG. 8A illustrates the behavior of the input differential signals, $V_p^{(i)}$ and $V_n^{(i)}$, while, FIG. 8B illustrates the delayed signals, $V_p^{(d)}$ and $V_n^{(d)}$, which are completely same with those shown in FIGS. 4A and 4B or FIGS. 6A and 6B. FIG. 8C shows the differential outputs, $I_1^{(OR)}$ and $I_1^{(NOR)}$, of the first arithmetic unit 344, where the current $I_1^{(OR)}$ denoted by a solid line rises at the leading edge of the $V_p^{(i)}$ and falls at the falling edge of the $V_p^{(d)}$. FIG. 8D shows the outputs, $I_2^{(OR)}$ and $I_2^{(NOR)}$, of the second arithmetic unit 345, where $I_2^{(OR)}$ rises at the leading edge of $V_n^{(i)}$ while falls at the falling edge of $V_n^{(d)}$. FIG. 8E is the outputs from the symmetrical unit 342 that inverts the input signals, $V_p^{(d)}$ and $V_n^{(d)}$, but the magnitude thereof depends on the control signal CTRL (sum) which is denoted by a parameter b in FIG. 8E. FIG. 8F shows the summed currents, $I_p^{(asym)}$ and $I_n^{(asym)}$, of the outputs from two arithmetic units, 344 and 345. The current $I_p^{(asym)}$ is generated from a sum of $I_1^{(OR)}$ and $I_2^{(OR)}$ and never falls to zero. Finally, FIG. 8G shows the current outputs, $I_p^{(t)}$ and $I_n^{(t)}$, from the LD driver 3, where the positive phase current $I_p^{(t)}$ is summed with the positive phase output $I_p^{(m)}$ of the primary driver 33, the negative phase output $I_n^{(s)}$ of the sub-driver 234. Similar to aforementioned examples shown in FIGS. 4 and 6, the current output $I_p^{(t)}$ from the LD driver 3 shows relatively faster falling edge and relatively slower rising edge, which may effectively compensate the intrinsic characteristics of the LD 21 in the TOSA 2.

(Fourth Embodiment)

Figure 9:
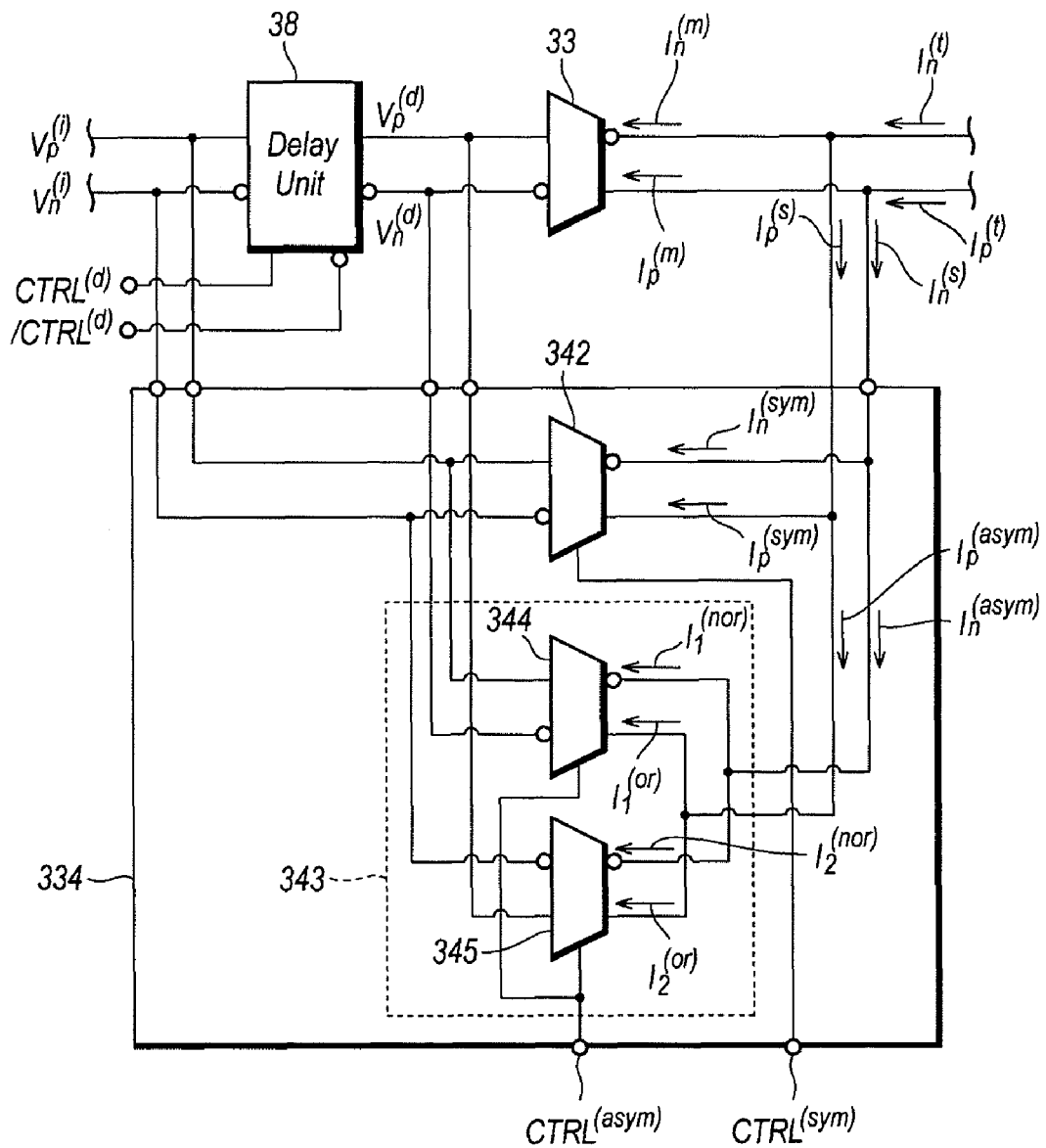
FIG. 9 shows still another arrangement of the sub-driver according to the fourth embodiment of the present invention.

FIG. 9 shows a block diagram of a primary portion of the LD driver 3 according to the fourth embodiment of the present invention. The LD driver of the present embodiment includes a delay unit in an upstream side of the primary driver 33, which is the same arrangement with the former embodiment, and a sub-driver 334 with a new arrangement. The sub-driver 334 of the present embodiment also comprises a symmetrical driver and an asymmetrical driver 343 including two arithmetic units, 344 and 345. A feature of the present sub-driver 334 is that the first arithmetic unit 344 in the asymmetrical driver 343 carries out the OR operation between two signals of $V_p^{(i)}$ and $V_n^{(d)}$ not $Vi^{(d)}$ and the second arithmetic unit 345 carries out the OR operation between two signals of $V_n^{(i)}$ and $V_p^{(d)}$ not $V_n^{(d)}$ in the former embodiment shown in FIG. 7, that is, the arithmetic units, 344 and 345, inverses the signals, $V_p^{(d)}$ and $V_n^{(d)}$.

Specifically, the first arithmetic unit 344 outputs the currents, $I_1^{(OR)}$ and $I_1^{(NOR)}$, which reflects the OR/NOR operation between signals, $V_p^{(i)}$ and $V_n^{(d)}$, but the magnitude thereof depends on the control signal $CTRL^{(asym)}$ supplied to the current source of the differential circuit shown in FIG. 3B. The second arithmetic unit 315 outputs the currents, $I_2^{(OR)}$ and $I_2^{(NOR)}$, which also reflects the OR/NOR operation between signals, $V_n^{(i)}$ and $V_p^{(d)}$. The asymmetrical driver 343 sums the former current $I_1^{(OR)}$ with the latter current $I_2^{(OR)}$, and $I_1^{(NOR)}$ with $I_2^{(NOR)}$, to generate the current $I_p^{(asym)}$ and $I_n^{(asym)}$, respectively. The sub-driver 334 generates the output currents, $I_p^{(s)}$ and $I_n^{(s)}$, by adding the symmetrical current $I_p^{(sym)}$ with the asymmetrical current $I_p^{(asym)}$, $I_n^{(sym)}$ with $I_n^{(asym)}$. Finally, the LD driver 3 adds the current $I_p^{(m)}$ from the primary driver with the sub-driver current $I_n^{(s)}$, which has a phase opposite to the primary current $I_p^{(m)}$, to generate the total current $I_p^{(t)}$.

Figure 10A:
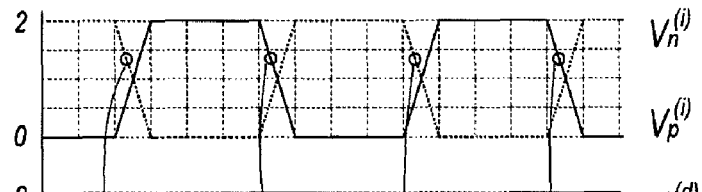
FIGS. 10A to 10G illustrate time charts of respective units in the LD driver of the fourth embodiment.
Figure 10B:
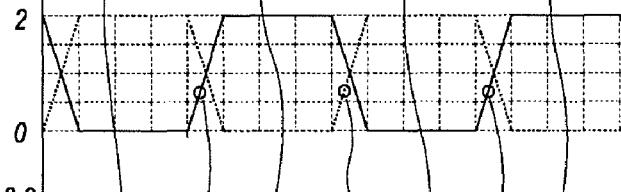
Figure 10C:
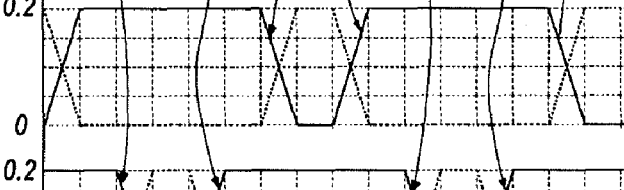
Figure 10D:
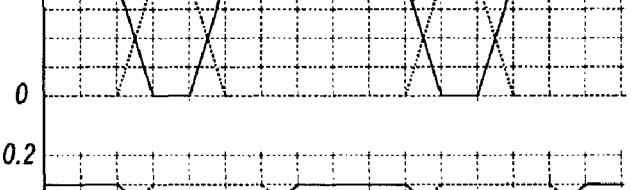
Figure 10E:
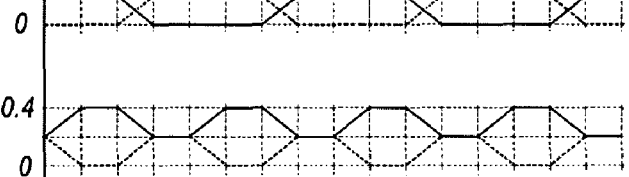
Figure 10F:
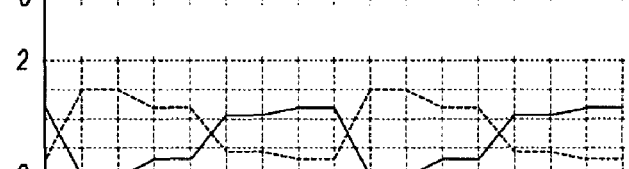
Figure 10G:
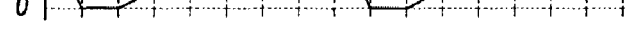

FIGS. 10A to 10G show time charts of signals output from respective elements shown in FIG. 9. FIGS. 10A and 10B are the input signals, $V_p^{(i)}$ and $V_n^{(i)}$, and the delayed signals, $V_p^{(d)}$ and $V_n^{(d)}$, which are the same with those shown in the foregoing examples. FIG. 10C shows the output currents, $I_1^{(OR)}$ and $I_1^{(NOR)}$, of the first arithmetic unit 344, where the leading edge thereof is determined by the leading edge of $V_n^{(d)}$ and the falling edge is determined by the falling edge of $V_p^{(i)}$. FIG. 10D shows the current $I_2^{(OR)}$ and $I_2^{(NOR)}$, output from the second arithmetic unit 345, where the leading edge thereof is determined by the leading edge of $V_p^{(d)}$ while the falling edge is determined by the falling edge of $V_n^{(i)}$. The magnitude of respective current output from the first and second arithmetic units, 344 and 345, are also controlled by the signal $CTRL^{(asym)}$ similar to those aforementioned examples. FIG. 10E shows the current $I_p^{(sym)}$ output from the symmetrical driver 342, where the phases thereof inverts the input signals, $V_p^{(i)}$ and $V_n^{(i)}$, but the magnitudes is determined by the control signal $CTRL^{(sym)}$. FIG. 10F shows the output currents, $I_p^{(asym)}$ and $I_n^{(asym)}$, output from the asymmetrical driver 343, which adds the first OR current $I_1^{(OR)}$ with the second OR current $I_2^{(OR)}$. Note that the output current, $I_p^{(asym)} = I_1^{(OR)} + I_2^{(OR)}$, never falls to zero. Finally, FIG. 10G shows the total currents, $I_p^{(t)}$ and $I_n^{(t)}$, output from the LD driver 3, where the positive phase current $I_p^{(t)}$ is a sum of the primary current $I_p^{(m)}$ with the positive phase and the sub-driver current $I_n^{(s)}$ with the negative phase and this negative phase sub-driver current $I_n^{(s)}$ is a sum of the negative phase currents of $I_n^{(sym)}$ and $I_n^{(asym)}$. As shown in FIG. 10G, the final current $I_p^{(t)}$ shows a faster falling edge and a relatively slower rising edge, which may effectively compensate an intrinsic characteristic of the LD 21.

(Fifth Embodiment)

Figure 11:
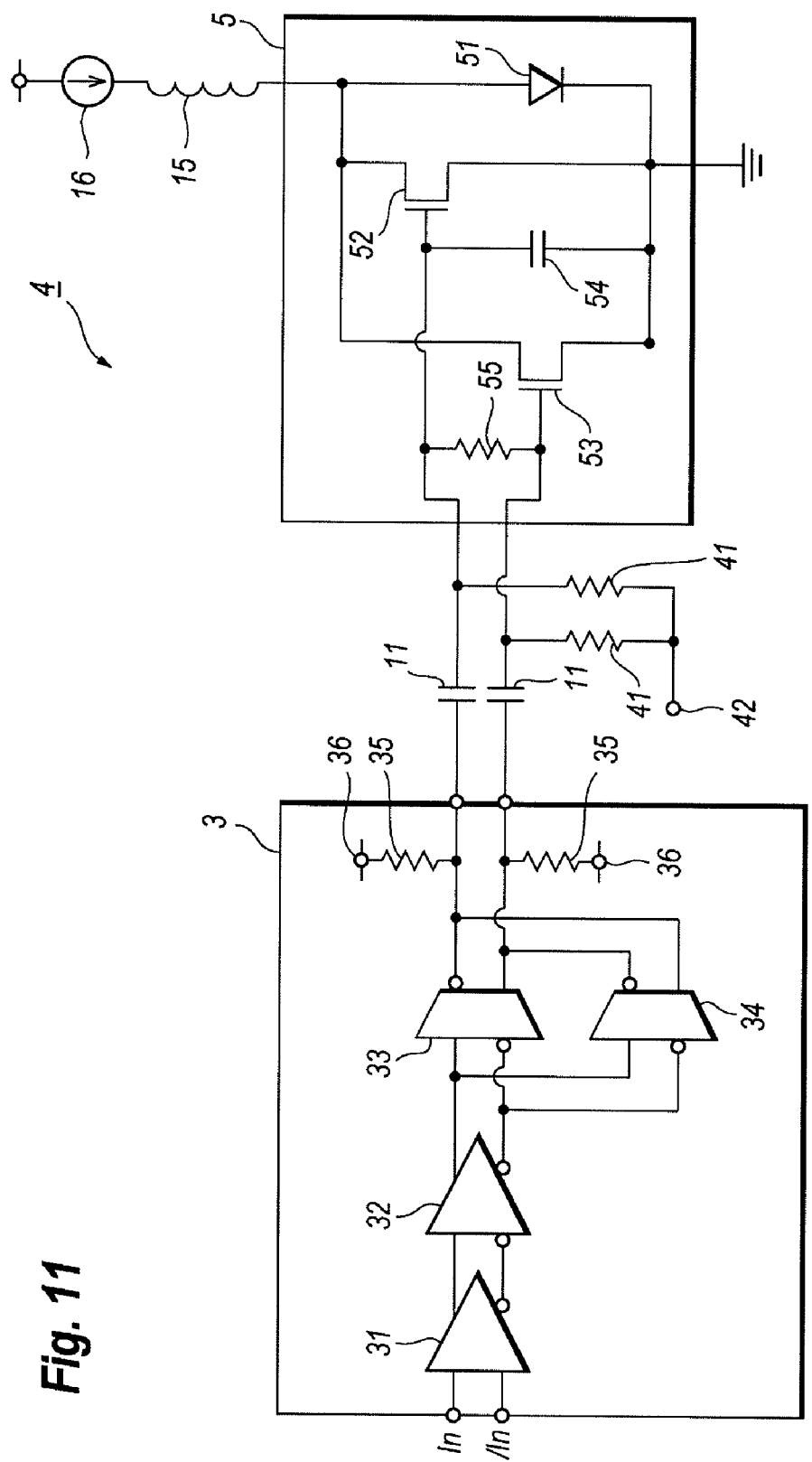
FIG. 11 shows a block diagram of an optical transmitter according to the fifth embodiment of the present invention.

Next, another embodiment of the optical transmitter will be described as referring to FIG. 11. The modified optical transmitter 4 shown in FIG. 11 includes a modified TOSA 5 with two signal inputs each being biased by the bias source 42 through resistors 41. Other arrangements are similar to or same with those of the aforementioned optical transmitter 1 shown in FIG. 1.

Figure 12A:
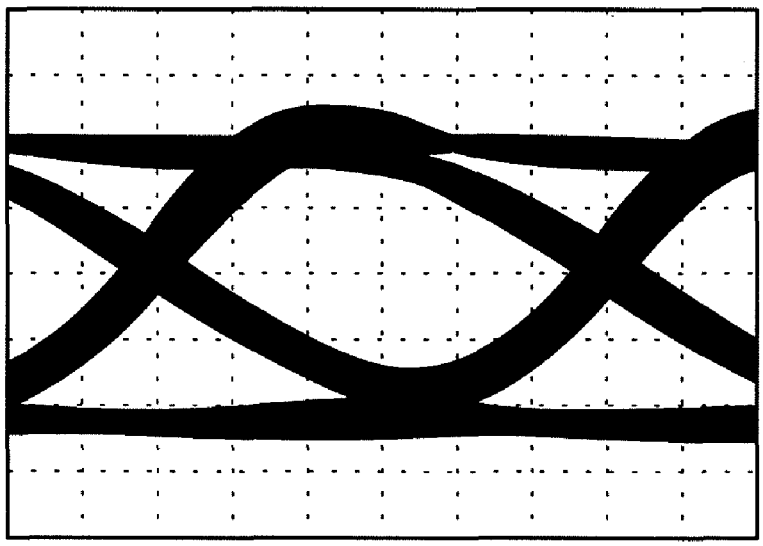
FIGS. 12A and 12B compare the optical waveform output from a conventional optical transmitter and the optical transmitter of the present invention, respectively.
Figure 12B:
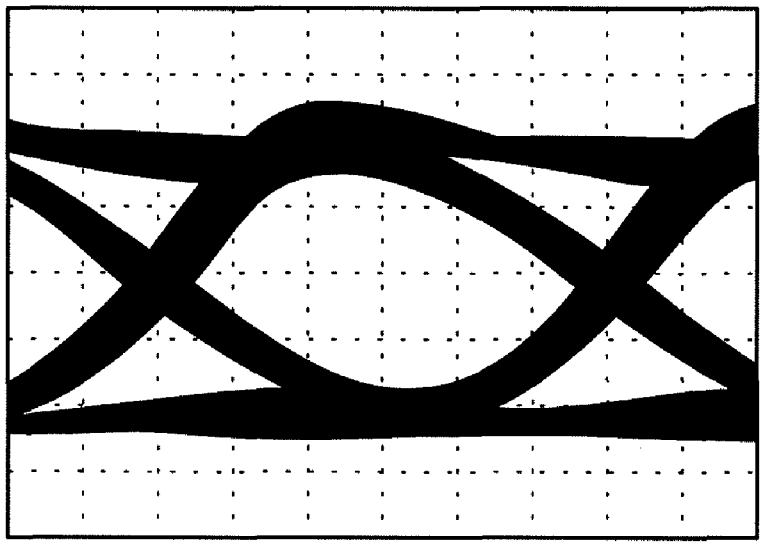

FIGS. 12A and 12B compare the optical output from the LD that is driven by a conventional LD driver and by the LD driver with the sub-driver according to the present invention. I$_n$ FIG. 12A, the falling edge leaves a substantial width of the low level but that shown in FIG. 12B reduces the width of the low level at the falling edge, which is one feature of the LD driver according to the present invention. Furthermore, an opening of the eye diagram is also improved in FIG. 12B.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. An LD driver to generate a driving current with a falling edge faster than a leading edge thereof, comprising:
    a delay unit configured to receive an input signal to output a delayed signal delayed by a variable period with respect to said input signal;
    a primary driver configured to convert one of said input signal and said delayed signal to a primary current by a first conversion ratio; and
    a sub-driver connected in parallel to said primary driver, said sub-driver including a symmetrical driver and an asymmetrical driver, wherein said symmetrical driver converting one of said delayed signal and said input signal into a symmetrical current by a second conversion ratio, wherein said asymmetrical driver including two arithmetic units, each carrying out an OR operation between said input signal and said delayed signal and converting a result of said OR operation into an asymmetrical current by a third conversion ratio,
    wherein said LD driver outputs said driving current by adding said primary current, said symmetrical current and said asymmetrical current.

2. The LD driver of claim 1,
    wherein said input signal and said delayed signal has a differential mode with a positive phase and a negative phase, and
    wherein one of said arithmetic units carries out said OR operation between said input signal with said positive phase and said delayed signal with said positive phase, and other of said arithmetic units carries out said OR operation between said input signal with said negative phase and said delayed signal with said negative phase.

3. The LD driver of claim 1,
    wherein said input signal and said delayed signal has a differential mode with a positive phase and a negative phase, and
    wherein one of said arithmetic units carries out said OR operation between said input signal with said positive phase and said delayed signal with said negative phase, and other of said arithmetic units carries out said OR operation between said input signal with said negative phase and said delayed signal with said positive phase.

4. The LD driver of claim 1,
    wherein said symmetrical driver converts said input signal into said symmetrical current.

5. The LD driver of claim 1,
    wherein said symmetrical driver converts said delayed signal into said symmetrical current.

6. The LD driver of claim 1,
    wherein said primary current, said symmetrical current and said asymmetrical current have a differential mode with a positive phase and a negative phase, and
    wherein said driving current adds said primary current with said positive phase with said symmetrical current and said asymmetrical current each having said negative phase.

7. The LD driver of claim 1,
    wherein said symmetrical driver has a differential circuit with a current source with a transistor,
    wherein said second conversion ratio is adjustable by varying a bias of said transistor.

8. The LD driver of claim 1,
wherein said asymmetrical driver has a differential circuit having a pair of transistors connected in parallel to each other, a reference transistor consisting a differential pair with respect to said paired transistor, and a current source with a source transistor,
wherein said third conversion ratio is adjustable by varying a bias of said source transistor.

9. The LD driver of claim 1,
wherein said delay unit adjusts said variable period by an external control signal.

10. An optical transmitter, comprising:
a transmitter optical subassembly including a laser diode and an active device connected in parallel with respect to said laser diode, said active device shunting a current provided to said laser diode by receiving a driving signal with a falling edge faster than a leading edge; and
an LD driver including a primary driver and a sub-driver connected in parallel to said primary driver,
wherein said primary driver converts one of input signal input to said LD driver and a delayed signal delayed by a variable period with respect to said input signal into a primary current by a first conversion ratio, and said sub-driver includes a symmetrical driver and an asymmetrical driver, said symmetrical driver converting one of said input signal and said delayed signal into a symmetrical current by a second conversion ratio, said asymmetrical driver including two arithmetic units, each carrying out an OR operation between said input signal and said delayed signal and converting a result of said OR operation into an asymmetrical current by a third conversion ratio,
wherein said driving signal provided to said active device in said transmitter optical subassembly is a sum of said primary current, said symmetrical current and said asymmetrical current.

11. The optical transmitter of claim 10,
wherein said input signal, said delayed signal, said primary current, said symmetrical current, and said asymmetrical current has a differential mode with two signals each having a positive phase and a negative phase, and
wherein said driving current adds said primary current with said positive phase, said symmetrical current with said negative phase, and said asymmetrical current with said negative phase.

12. The optical transmitter of claim 11,
wherein said one of arithmetic units carries out said OR operation between said input signal with said positive phase and said delayed signal with said positive phase, and said other of said arithmetic units carries out said OR operating between said input signal with said negative phase and said delayed signal with said negative phase.

13. The optical transmitter of claim 11,
wherein said one of arithmetic units carries out said OR operation between said input signal with said positive phase and said delayed signal with said negative phase, and said other of said arithmetic units carries out said OR operating between said input signal with said negative phase and said delayed signal with said positive phase.

14. The optical transmitter of claim 11,
wherein said transmitter optical subassembly further includes another active device and a capacitor connected between a control electrode of said another active device and a ground, said another active device being driven by another driving current formed by adding said primary current with said negative phase, said symmetrical current with said positive phase, and said asymmetrical current with said positive phase.

15. The optical transmitter of claim 14,
wherein said active device and said another active device has a period of commonly turning on.

* * * * *